United States Patent
Miller (10) Patent No.: US 6,356,577 B1
(45) Date of Patent: Mar. 12, 2002

(54) METHOD AND APPARATUS FOR COMBINING LIGHT OUTPUT FROM MULTIPLE LASER DIODE BARS

(75) Inventor: Gregory David Miller, Foster City, CA (US)

(73) Assignee: Silicon Light Machines, Sunnyvale, CA (US)

( * ) Notice: Subject to any disclaimer, the term of this patent is extended or adjusted under 35 U.S.C. 154(b) by 0 days.

(21) Appl. No.: 09/354,643

(22) Filed: Jul. 15, 1999

(51) Int. Cl.[7] .................................................. H01S 3/08
(52) U.S. Cl. ......................... 372/107; 372/100; 372/69
(58) Field of Search ............................ 372/107, 92, 70, 372/99, 34, 100; 346/108; 359/625

(56) References Cited

U.S. PATENT DOCUMENTS

| | | | | |
|---|---|---|---|---|
| 4,661,828 A | * | 4/1987 | Miller, Jr. et al. | .......... 346/108 |
| 5,168,401 A | * | 12/1992 | Endriz | .......... 359/625 |
| 5,216,544 A | * | 6/1993 | Horikawa et al. | .......... 372/34 |
| 5,606,181 A | | 2/1997 | Sakuma et al. | .......... 257/88 |
| 5,808,323 A | * | 9/1998 | Spaeth et al. | .......... 372/107 |

OTHER PUBLICATIONS

Hawkes et al., "Lasers Theory and Practice," Prentice Hall, New York, 1995, pp. 407–408.

* cited by examiner

*Primary Examiner*—Leon Scott, Jr.
(74) *Attorney, Agent, or Firm*—Haverstock & Owens LLP (57) ABSTRACT

A method and apparatus for combining light output from multiple laser diode bars is disclosed. The apparatus includes two laser diode bars and a mirror arrangement placed between the laser diode bars. The mirror arrangement reflects the light output from the laser diode bars into a preferred plane and a preferred direction. The mirror arrangement is preferably comprised of metal mirrors. Alternative mirror assemblies disclosed are based on prisms. An alternative mirror disclosed includes a cylindrically concave surface for collimating or focusing an individual laser beam.

25 Claims, 9 Drawing Sheets

METHOD AND APPARATUS FOR COMBINING LIGHT OUTPUT FROM MULTIPLE LASER DIODE BARS

FIELD OF THE INVENTION

The present invention relates to the field of lasers. More particularly, the present invention relates to laser diode bars.

BACKGROUND OF THE INVENTION

Figure 1:
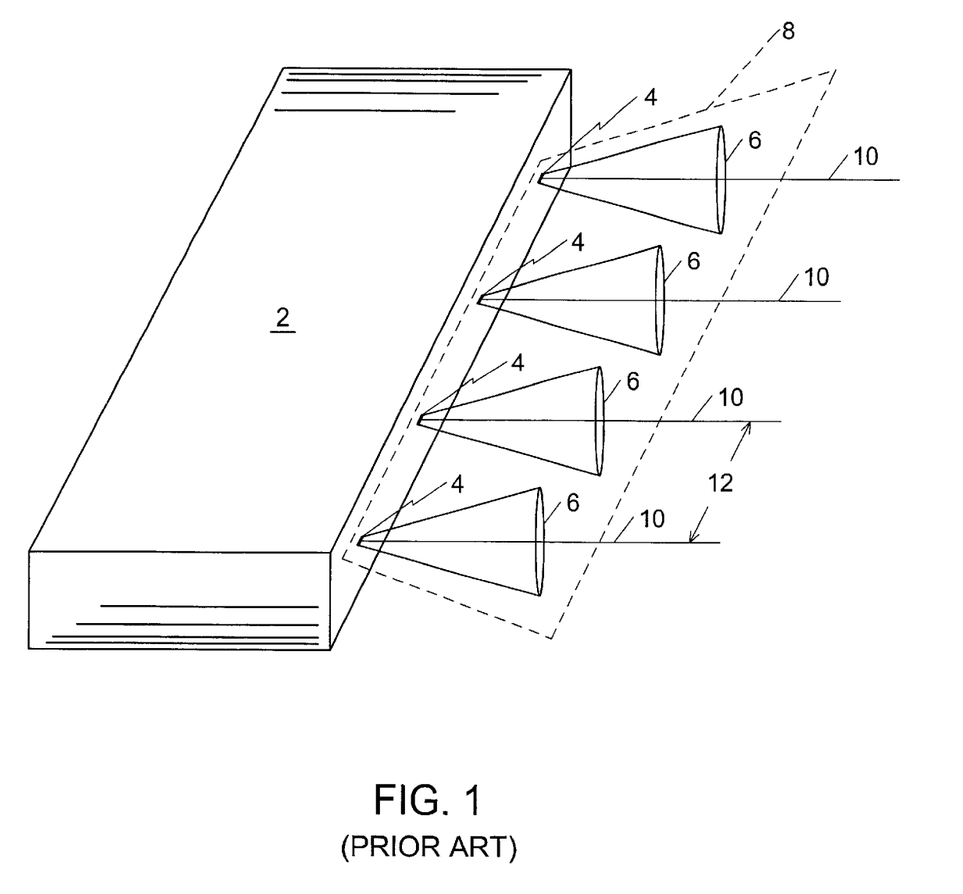
FIG. 1 illustrates a laser diode bar of the prior art.

A laser diode bar of the prior art is illustrated in FIG. 1. The laser diode bar 2 includes a plurality of light emitting surfaces 4. The plurality of light emitting surfaces 4 each emit a laser beam 6. The plurality of light emitting surfaces form a linear array. The laser beams 6 combine to form a light output 8. Each laser beam is located on a center 10. The centers 10 are located on a pitch 12 and lie in a plane.

A laser diode bar has an upper limit on power output. Hawkes et al. in "Lasers Theory and Practice," pages 407 and 408, teach that linear arrays of laser diodes can be stacked in order to produce higher output. In some applications it would be advantageous to increase the power output while maintaining the centers of the laser beams in a common plane.

What is needed is a method of combining light output from multiple laser diode bars while placing the centers of the laser beams in a common plane.

SUMMARY OF THE INVENTION

This invention is a method and apparatus for combining light output from multiple laser diode bars. The apparatus includes two laser diode bars and a mirror arrangement placed between the laser diode bars. The mirror arrangement reflects the light output from the laser diode bars into a preferred plane and a preferred direction. The mirror arrangement is preferably comprised of metal mirrors. Alternative mirror arrangements are based on prisms. An alternative mirror includes a cylindrically concave surface for collimating or focusing an individual laser beam.

DETAILED DESCRIPTION OF THE PREFERRED EMBODIMENT

Figure 2:
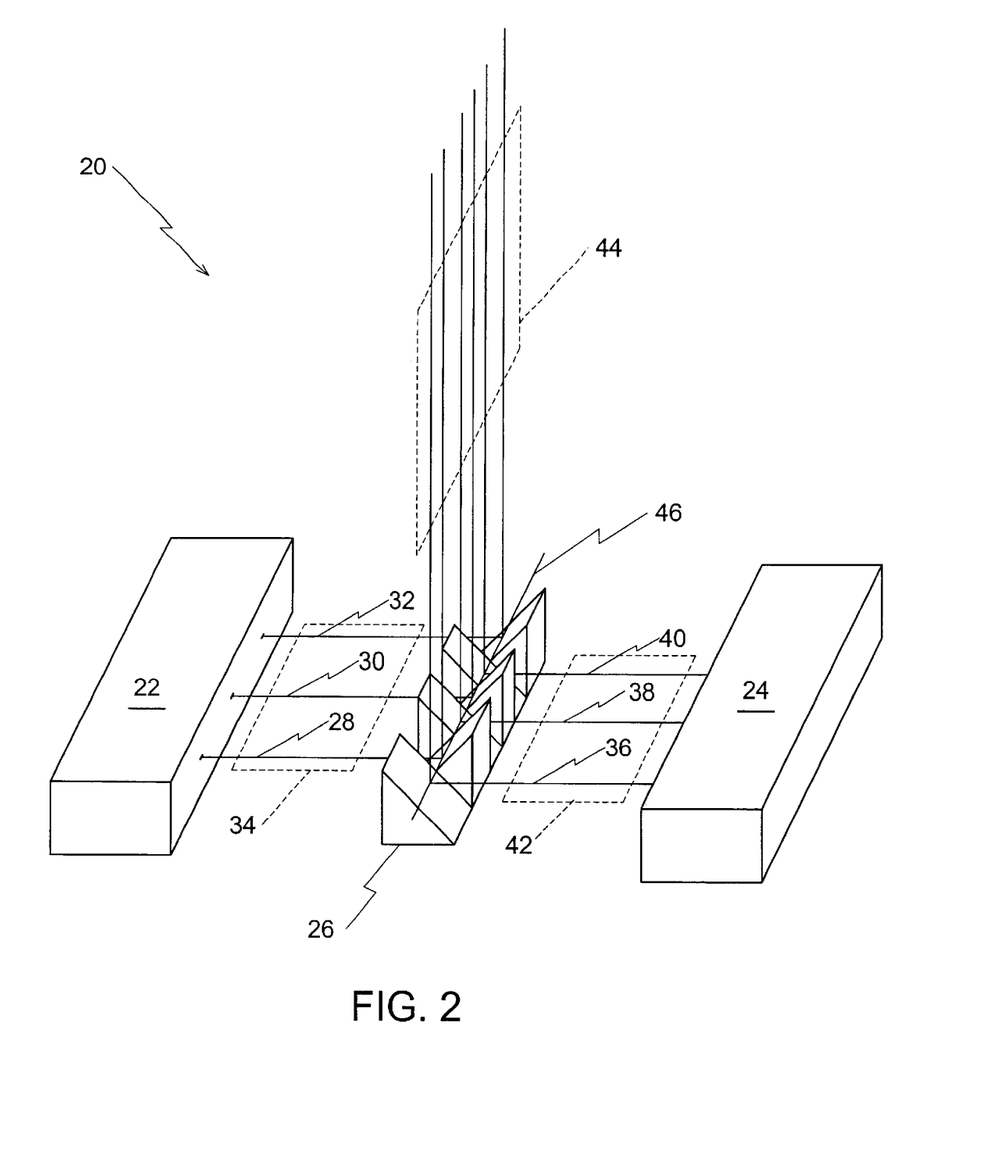
FIG. 2 illustrates the preferred embodiment for combining light output from multiple laser diode bars of the present invention.

The preferred embodiment for combining light output from multiple laser diode bars of the present invention is illustrated in FIG. 2. The preferred embodiment 20 includes a first diode laser bar 22, a second diode laser bar 24, and a preferred mirror arrangement 26. The first laser diode bar 20 is placed to a first side of the preferred mirror arrangement 26. The second laser diode bar 24 is placed to a second side of the preferred mirror arrangement 26. The first laser diode bar 22 emits a first laser beam 28, a second laser beam 30, and a third laser beam 32. The first, second, and third laser beams 28, 30, and 32 as well as other laser beams of the present invention are illustrated in the figures by centers of the laser beams in order to clearly illustrate the present invention. The first, second, and third laser beams 28, 30, and 32 comprise a first light output 34. It will be apparent to one of ordinary skill in the art that the first laser diode bar 22 can be configured to emit more or fewer laser beams.

The second laser diode bar 24 emits a fourth laser beam 36, a fifth laser beam 38, and a sixth laser beam 40. The fourth, fifth, and sixth laser beams 36, 38, and 40 comprise a second light output 42. The second laser diode bar 24 can be configured to emit more or fewer laser beams.

Upon encountering the preferred mirror arrangement 26, the first light output 34 and the second light output 42 are reflected into a common direction. The first light output 34 and the second light output 42 form a preferred combined light output 44. The first, second, and third laser beams 28, 30, and 32 are interdigitated with the fourth, fifth, and sixth laser beams 36, 38, and 40 to form the preferred combined light output 44.

The first, second, and third laser beams 28, 30, and 32 are on a first pitch with first centers. The first centers define a first plane between the first laser diode bar 22 and the preferred mirror arrangement 26. The fourth, fifth, and sixth laser beams 36, 38, and 40 are on a second pitch with second centers. The second centers define a second plane between the second laser diode bar 24 and the preferred mirror arrangement 26. The first pitch and the second pitch are preferably equal. The first, second, and third laser beams 28, 30, and 32 encounter the first mirror arrangement 26 about an intersecting line 46. The fourth, fifth, and sixth laser beams 36, 38, and 40 also encounter the first mirror arrangement 26 about the intersecting line 46. At the intersecting line 46, the second centers are preferably offset from the first centers by half the first pitch. Upon the first and second light outputs 34 and 42 reflecting from the preferred mirror arrangement 26, the first and second centers define a common plane.

Figure 3:
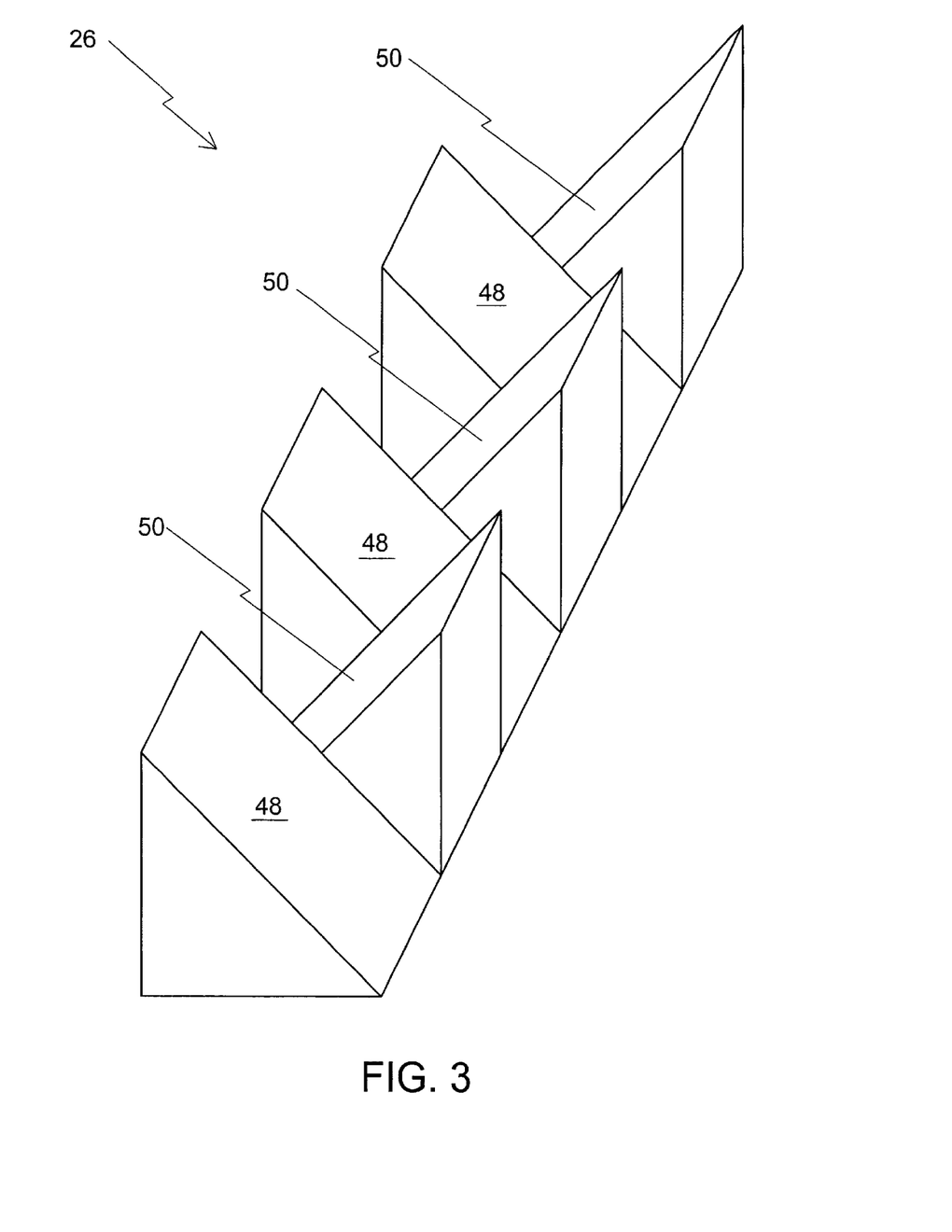
FIG. 3 illustrates the preferred mirror arrangement of the present invention.

The preferred mirror arrangement 26 of the present invention is illustrated in FIG. 3. The preferred mirror arrangement 26 includes first mirrors 48 and second mirrors 50. The first and second mirrors 48 an 50 are preferably metallic mirrors. Alternatively, the first and second mirrors 48 and 50 are formed of glass and coated with a reflective material.

Figure 4:
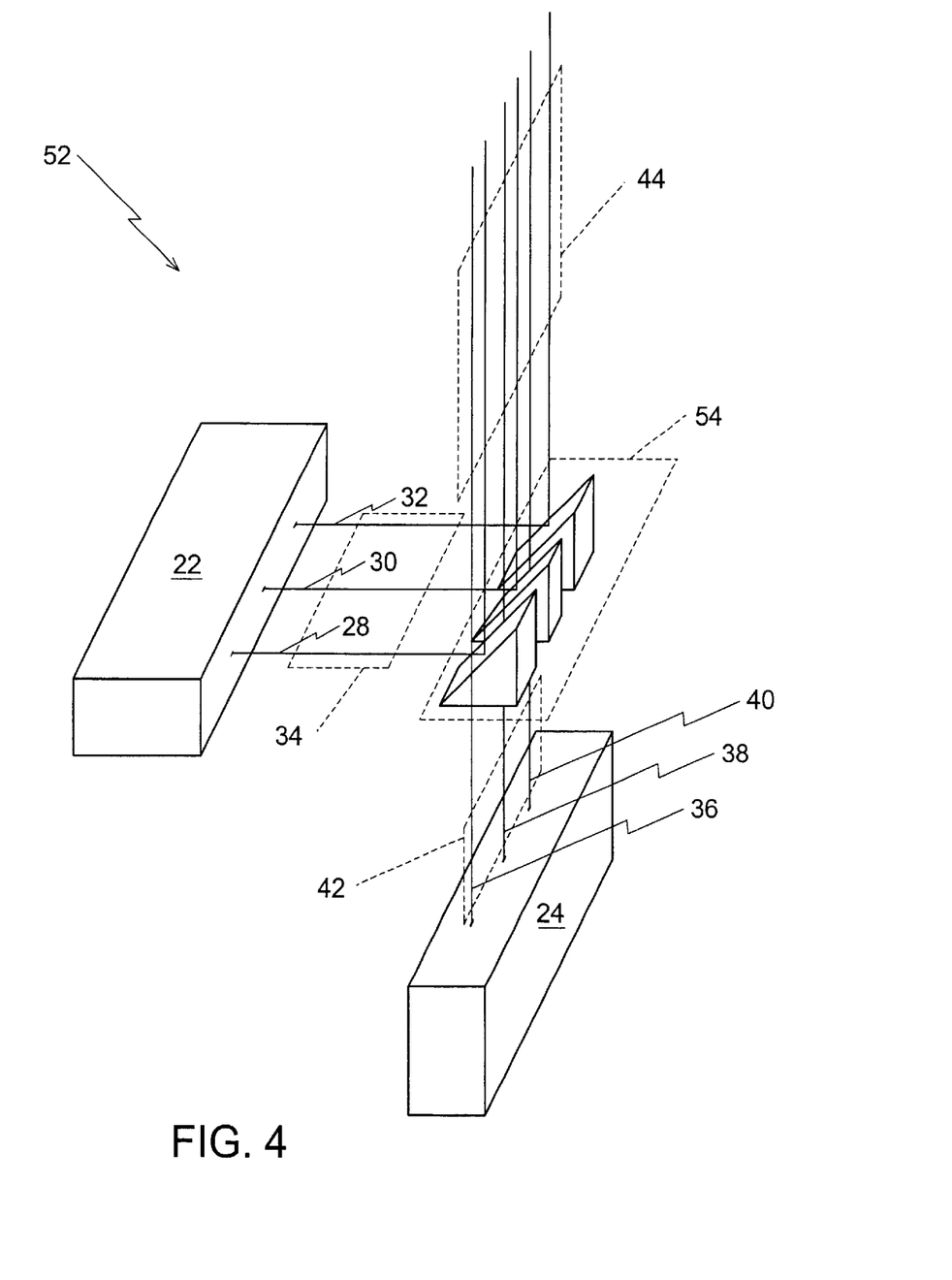
FIG. 4 illustrates a first alternative embodiment for combining light output from multiple laser diode bars of the present invention.

A first alternative embodiment for combining light output from multiple laser diode bars of the present invention is illustrated in FIG. 4. The first alternative embodiment 52 includes the first and second diode laser bars 22 and 24, and a first alternative mirror arrangement 54. The first laser diode bar 22 is placed to a side of the first alternative mirror arrangement 54. The second laser diode bar 24 is placed below the first alternative mirror arrangement 54. The first laser diode bar 42 emits the first, second, and third laser beams 28, 30, and 32, which comprise the first light output 34. The second laser diode bar 24 emits the fourth, fifth, and sixth laser beams 36, 38, and 40, which comprise the second light output 42. The second light output 42 has a preferred direction. The first alternative mirror arrangement 54 allows the second light output 42 to pass the first alternative mirror arrangement 54 unimpeded. The first alternative mirror arrangement 54 reflects the first light output 34 into the preferred direction. The first light output 34 and the second light output 42 combine to form the preferred combined light output 44. The first, second, and third laser beams 28, 30, and 32 are interdigitated with the fourth, fifth, and sixth laser beams 36, 38, and 40 to form the preferred combined light output 44.

Figure 5:
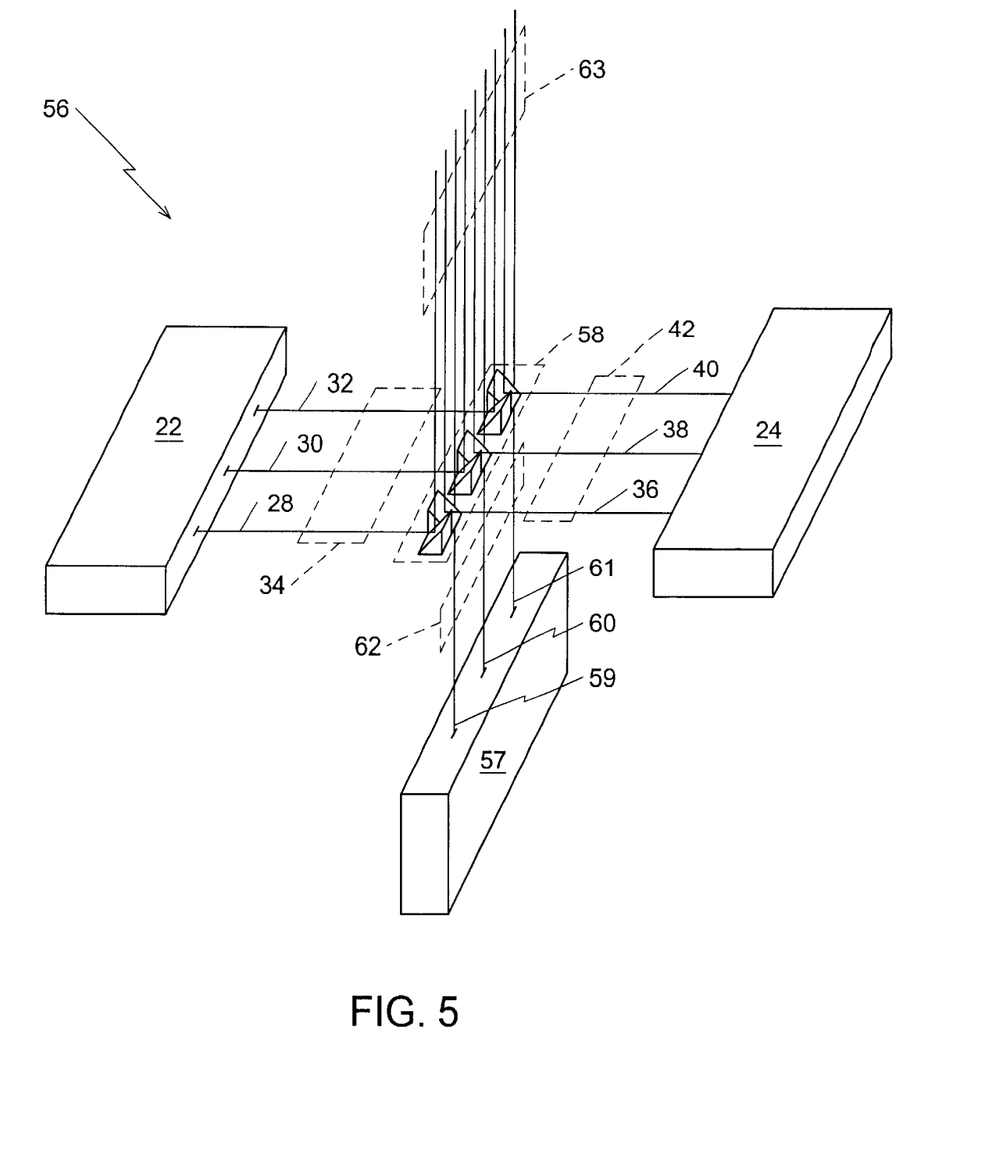
FIG. 5 illustrates a second alternative embodiment for combining light output from multiple laser diode bars of the present invention.

A second alternative embodiment for combining light output from multiple laser diode bars of the present invention is illustrated in FIG. 5. The second alternative embodiment 56 includes the first laser diode bar 22, the second laser diode bar 24, a third laser diode laser bar 57, and a second alternative mirror arrangement 58. The first laser diode bar 22 emits the first, second, and third laser beams 28, 30, and 32, which comprise the first light output 34. The second laser diode bar emits the fourth, fifth, and sixth laser beams 36, 38, and 40, which comprise the second light output 42. The third laser diode bar 57 emits a seventh laser beam 59, an eighth laser beam 60, and a ninth laser beam 61. The third laser diode bar 57 can be configured to emit more or fewer laser beams.

The seventh, eighth, and ninth laser beams 59, 60, and 61 form a third light output 62. The seventh, eighth, and ninth laser beams 59, 60, and 61 define the preferred direction. The seventh, eighth, and ninth laser beams 59, 60, and 61 are on a third pitch with third centers. The third centers define the common plane.

The second alternative mirror arrangement 58 reflects the first light output 34 into the preferred direction and such that the first centers lie in the common plane. The second alternative mirror arrangement 58 reflects the second light output 42 into the preferred direction such that the second centers lie in the common plane. The first, second and third light outputs 34, 42, and 62 form a first alternative combined light output 63.

Figure 6:
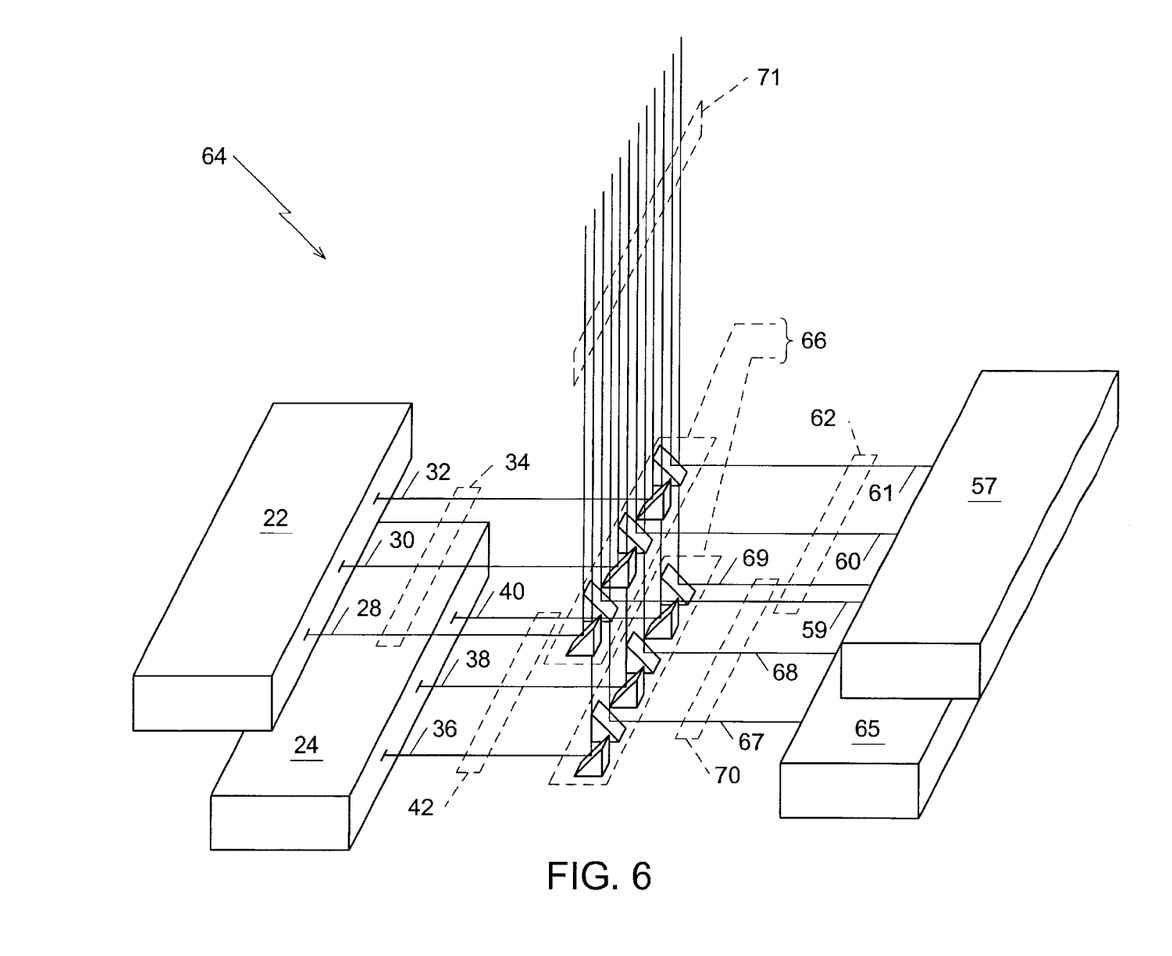
FIG. 6 illustrates a third alternative embodiment for combining light output from multiple laser diode bars of the present invention.

A third alternative embodiment for combining light output from multiple laser diode bars of the present invention is illustrated in FIG. 6. The third alternative embodiment 64 includes the first, second, and third laser diode bars 22, 24, and 57, a fourth laser diode bar 65, and a third alternative mirror arrangement 66. The first laser diode bar 22 emits the first, second, and third laser beams 28, 30, and 32, which comprise the first light output 34. The second laser diode bar emits the fourth, fifth, and sixth laser beams 36, 38, and 40, which comprise the second light output 42. The third laser diode bar 57 emits the seventh, eighth, and ninth laser beams 59, 60, and 61, which comprise the third light output 62. The fourth laser diode bar 65 emits a tenth laser beam 67, an eleventh laser beam 68, and a twelfth laser beam 69, which comprise a fourth light output 70. The fourth laser diode bar 65 can be configured to emit more or fewer laser beams. The third alternative mirror arrangement 66 reflects the first, second, third, and fourth light outputs into the common plane and the preferred direction to form a second alternative combined light output 71.

It will be readily apparent to one of ordinary skill in the art that additional laser diode bars can be added to the third alternative embodiment 64. For example, a fifth leaser diode bar (not shown) could be added by modifying the third alternative mirror arrangement 66 and placing the fifth laser diode bar below the third alternative mirror arrangement 66.

Figure 7A:
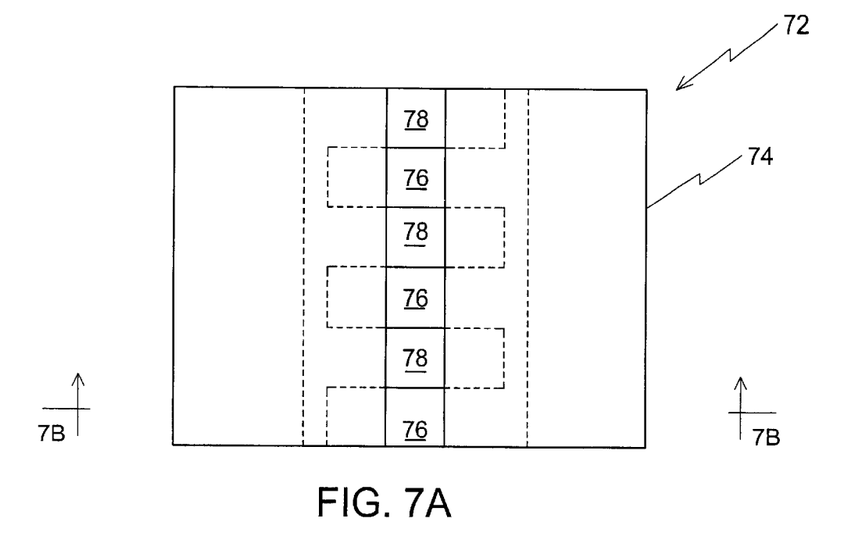
FIG. 7A illustrates an assembly of prism mirrors of the present invention.
Figure 7B:
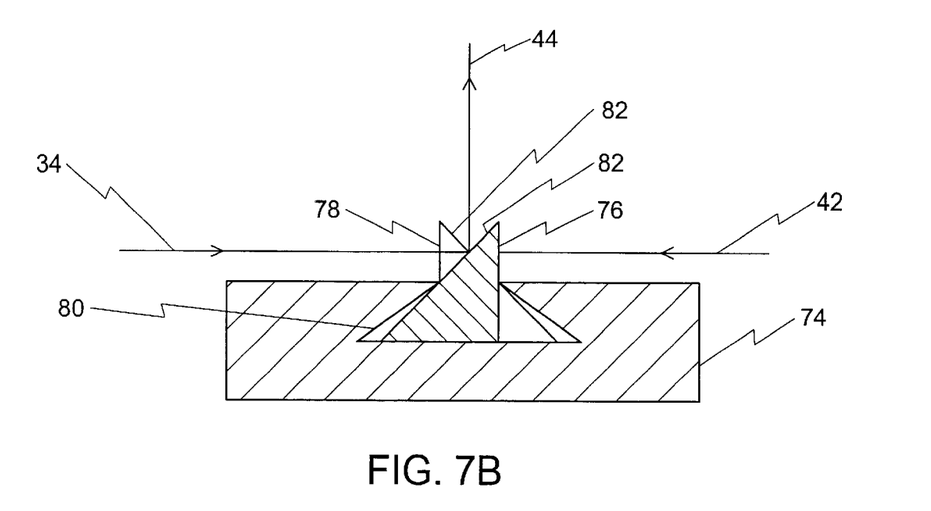
FIG. 7B illustrates a cross section of the assembly of prism mirrors of the present invention.

A fourth alternative mirror arrangement of the present invention is illustrated in FIG. 7A. The fourth alternative mirror arrangement 72 includes a first prism housing 74, first prisms 76, and second prisms 78. A cross section of the fourth alternative mirror arrangement 72 is illustrated in FIG. 7B. The first prisms 76 are oriented towards a side of the first prism housing 74. The second prisms 78 are oriented towards the opposite side of the first prism housing 74. The first and second prisms 76 and 78 are placed in a first dove-cut groove 80 of the first prism housing 74. The first and second prisms 76 and 78 can be held by adhesive, solder, or diffusion bonding. Alternatively, the first prisms and second prisms 76 and 78 can be integrally formed from a single glass block. The first and second prisms 76 and 78 reflect light from coatings 82. The coatings 82 can be metallic coatings or multilayered dielectric coatings. In operation, the first light output 34 reflects from the first prisms 76. The second light output 42 reflects from the second prisms 78. Upon reflection, the first and second light outputs 34 and 42 combine to form the preferred combined light output 44.

Figure 8A:
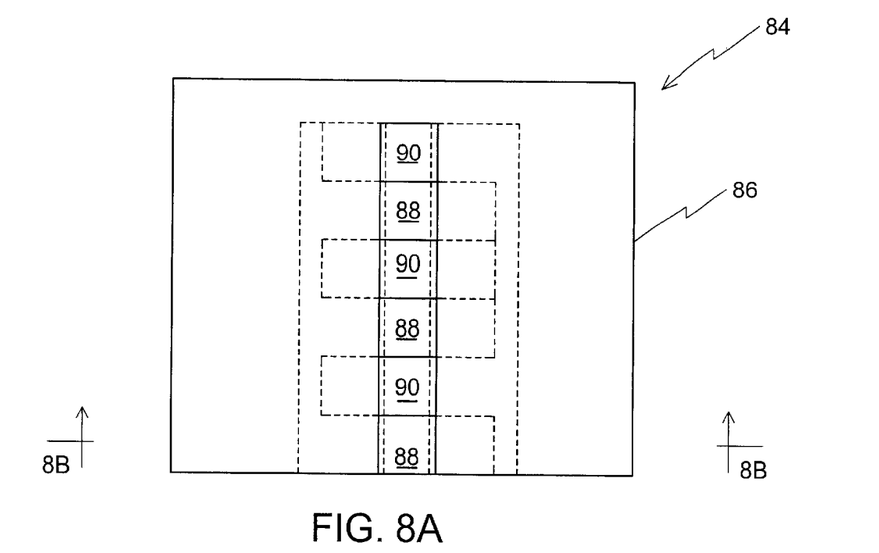
FIG. 8A illustrates an alternative assembly of prism mirrors of the present invention.
Figure 8B:
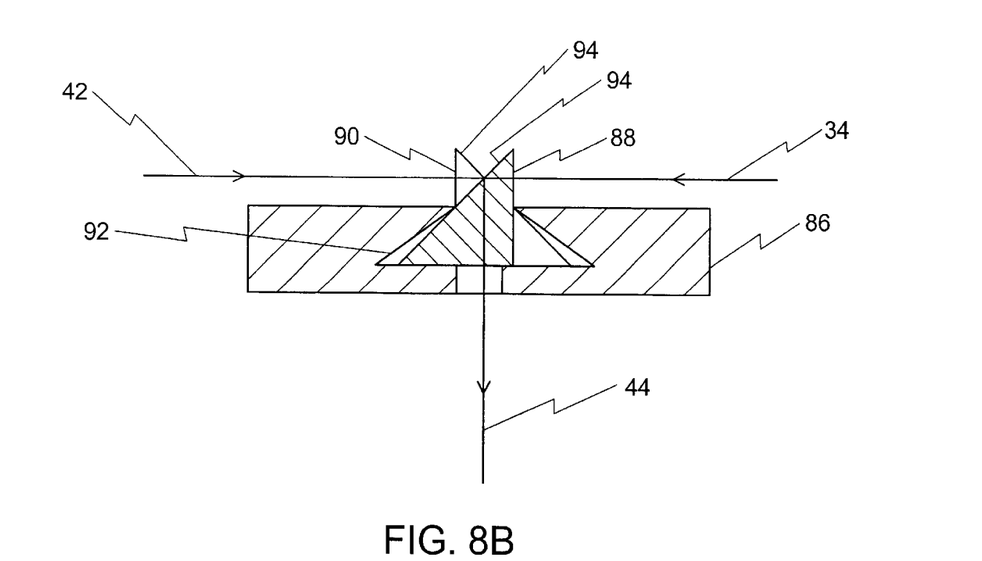
FIG. 8B illustrates a cross section of the alternative assembly of prism mirrors of the present invention.

A fifth alternative mirror arrangement of the present invention is illustrated in FIG. 8A. The fifth alternative mirror arrangement 84 includes a second prism housing 86, third prisms 88, and fourth prisms 90. A cross section of the fifth alternative mirror arrangement 84 of the present invention is illustrated in FIG. 8B. The third prisms 88 are oriented towards a side of the second prism housing 86. The second prisms 90 are oriented towards the opposite side of the second prism housing 86. The third and fourth prisms 88 and 90 are placed in a second dove-cut groove 92 of the second prism housing 86. The third and fourth prisms 88 and 90 can be held by adhesive, solder, or diffusion bonding. Alternatively, the third and fourth prisms 88 and 90 can be integrally formed from a single glass block. The third and fourth prisms 88 and 90 reflect light from prism facets 94 by total internal reflection. In operation, the first light output 34 reflects from the third prisms 88. The second light output 42 reflects from the fourth prisms 90. Upon reflection, the first and second light outputs 34 and 42 combine to form the preferred combined light output 44.

Figure 9:
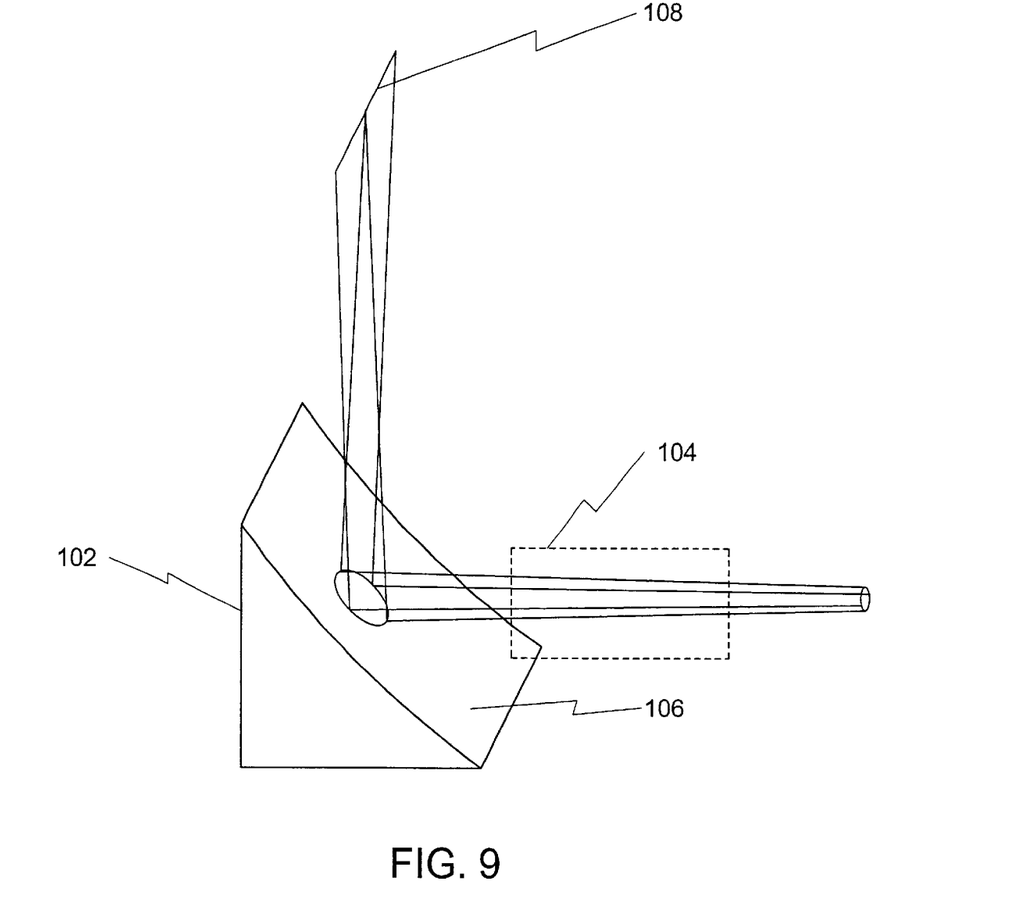
FIG. 9 illustrates a cylindrically concave mirror for focusing a laser beam of the present invention.

A first alternative mirror of the present invention is illustrated in FIG. 9. A prism 102 reflects light 104 from a cylindrically concave surface 106. The cylindrically concave surface 106 focuses the light 104 into a line segment 108. Focusing could also be performed by using a cylindrical lens (not shown). The light 104 focused into the line segment 108 could be coupled to a planar waveguide (not shown) placed at the line segment 108. Alternatively, the cylindrically concave surface 106 or the cylindrical lens could be configured to collimate the light 104. A second alternative mirror of the present invention replaces the cylindrically concave surface 106 of FIG. 9 with an aspherical surface. A third alternative mirror of the present invention replaces the cylindrically concave surface 106 of FIG. 9 with a diffractive surface. A fourth alternative mirror of the present invention replaces the cylindrically concave surface 106 of FIG. 9 with a non-imaging surface.

It will be readily apparent to one skilled in the art that other various modifications may be made to the preferred embodiment without departing from the spirit and scope of the invention as defined by the appended claims.

I claim:

1. An apparatus for combining laser light comprising:
   a. a first laser diode bar having a first linear array of light emitting surfaces and a first light output;
   b. a second laser diode bar having a second linear array of light emitting surfaces and a second light output; and
   c. means for combining the first light output and the second light output such that the first and second light outputs are interdigitated in a common plane.

2. An apparatus for combining laser light comprising:
   a. a first laser diode bar having a first linear array of light emitting surfaces and a first light output;
   b. a second laser diode bar having a second linear array of light emitting surfaces and a second light output; and
   c. a mirror arrangement being positioned such that the first and second light outputs combine and further such that the first and second light outputs lie in a common plane and have a common direction.

3. The apparatus of claim 2 wherein the mirror arrangement comprises a plurality of metal mirrors.

4. The apparatus of claim 2 wherein the mirror arrangement comprises a plurality of prisms each of the prisms reflecting light from a reflecting external surface.

5. The apparatus of claim 4 wherein the reflecting external surface comprises a metallic coating.

6. The apparatus of claim 4 wherein the reflecting external surface comprises a multilayered dielectric coating.

7. The apparatus of claim 2 wherein the mirror arrangement comprises a plurality of prisms, each of the prisms reflecting light from a prism facet by total internal reflection.

8. The apparatus of claim 2 wherein the mirror arrangement includes mirror surfaces that have been shaped to collimate the first light output and the second light output in the third plane.

9. The apparatus of claim 2 wherein the mirror arrangement includes mirror surfaces that have been shaped to focus the first light output and the second light output in the third plane.

10. The apparatus of claim 2 further comprising a third laser diode bar having a third plurality of light emitting surfaces and a third light output, wherein the mirror arrangement is configured such that the third light output is combined with the first and second light outputs in the common plane and further such that the third light output is directed in the common direction.

11. The apparatus of claim 10 further comprising a fourth laser diode bar having a fourth plurality of light emitting surfaces and a fourth light output, wherein the mirror arrangement is configured such that the fourth light output is combined with the first, second, and third light outputs in the common plane and further such that the fourth light output is directed in the common direction.

12. An apparatus for combining laser light comprising:
   a. a first laser diode bar having a first linear array of light emitting surfaces and a first light output;
   b. a second laser diode bar having a second linear array of light emitting surfaces and a second light output; and
   c. a mirror arrangement positioned such that the first light output and the second light output are combined in a common plane and a common direction, wherein the first light output is interdigitated with the second light output.

13. The apparatus of claim 12 wherein the mirror arrangement comprises a plurality of metal mirrors.

14. The apparatus of claim 12 wherein the mirror arrangement comprises a plurality of prisms each of the prisms reflecting light from a reflecting external surface.

15. The apparatus of claim 14 wherein the reflecting external surface comprises a metallic coating.

16. The apparatus of claim 14 wherein the reflecting external surface comprises a multilayered dielectric coating.

17. The apparatus of claim 12 wherein the mirror arrangement comprises a plurality of prisms each of the prisms reflecting light from a prism facet by total internal reflection.

18. A method of combining laser light comprising the steps of:
   a. providing a first plurality of laser outputs in a first plane;
   b. providing a second plurality of laser outputs in a second plane; and
   c. reflecting the first plurality of laser outputs and the second plurality of laser outputs into a third plane such that the first plurality of laser outputs and the second plurality of laser outputs are directed in a common direction, wherein the first light output is interdigitated with the second light output.

19. The method of claim 18 further comprising the step of collimating the first plurality of laser outputs and the second plurality of laser outputs in the third plane.

20. The method of claim 18 further comprising the step of focusing the first plurality of laser outputs and the second plurality of outputs in the third plane.

21. The method of claim 20 further comprising the step of coupling the first plurality of laser outputs and the second plurality of laser outputs into a planar waveguide.

22. A method of combining laser light comprising the steps of:
   a. providing a first plurality of laser outputs in a first plane;
   b. providing a second plurality of laser outputs in a second plane; and
   c. reflecting the second plurality of laser outputs into the first plane such that the first plurality of laser outputs and the second plurality of laser outputs are directed in a common direction, wherein the first light output is interdigitated with the second light output.

23. The method of claim 22 further comprising the step of collimating the first plurality of laser outputs and the second plurality of laser outputs in the first plane.

24. The method of claim 22 further comprising the step of focusing the first plurality of laser outputs and the second plurality of laser outputs in the first plane.

25. The method of claim 24 further comprising the step of coupling the first plurality of laser outputs and the second plurality of laser outputs into a planar waveguide.

* * * * *

UNITED STATES PATENT AND TRADEMARK OFFICE
CERTIFICATE OF CORRECTION

PATENT NO.     : 6,356,577 B1
DATED          : March 12, 2002
INVENTOR(S)    : Gregory D. Miller It is certified that error appears in the above-identified patent and that said Letters Patent is hereby corrected as shown below:

<u>Title page,</u>
Item [56], References Cited, under "U.S. PATENT DOCUMENTS", insert
-- 4,763,975     8/1998       Scifres et al.    350/96.15
4,940,309       7/1990        Baum              350/171 --.

Under "FOREIGN PATENT OR PUBLISHED FOREIGN PATENT APPLICATIONS", insert
-- EP 0423513A2    4/1991      H01S/3/085
EP 0423513A2      4/1991       H01S/3/085
DE 19751716A1     5/1998       G02B/27/14
DE 19846532C1     10/1998      G02B/27/09 --.

Signed and Sealed this

Second Day of July, 2002

Attest:

Attesting Officer

JAMES E. ROGAN
Director of the United States Patent and Trademark Office